United States Patent [19]

Ohmura et al.

[11] Patent Number: 4,858,558

[45] Date of Patent: Aug. 22, 1989

[54] FILM FORMING APPARATUS

[75] Inventors: Masanori Ohmura; Hiroshi Sakama; Kenji Araki, all of Tokyo, Japan

[73] Assignee: Nippon Kokan Kabushiki Kaisha, Tokyo, Japan

[21] Appl. No.: 146,712

[22] Filed: Jan. 21, 1988

[51] Int. Cl.$^4$ .................. C23C 16/46; C23C 16/52
[52] U.S. Cl. ..................................... 118/725; 118/730
[58] Field of Search ............... 118/730, 723, 725, 501

[56] References Cited

U.S. PATENT DOCUMENTS

| 3,594,227 | 7/1971 | Oswald | 437/172 |
| 4,597,986 | 7/1986 | Scapple et al. | 427/53.1 |
| 4,632,060 | 12/1986 | Goto et al. | 118/730 |
| 4,694,779 | 9/1987 | Hammond et al. | 118/730 |

FOREIGN PATENT DOCUMENTS

| 0147967 | 7/1985 | European Pat. Off. |
| 0223629 | 5/1987 | European Pat. Off. |
| 2168080 | 6/1986 | United Kingdom |

OTHER PUBLICATIONS

Patent Abstracts of Japan, vol. 8, No. 138 (C-231)[1575] Jun. 27, 1984; JP-A-59-50092 (Toshiba Kikai K.K.) Mar. 22, 1984.
Patent Abstracts of Japan, vol. 3, No. 86 (E-125), Jul. 24, 1979, p. 50E 125; JP-A-54-64977 (Nippon Denki K.K.) May 25, 1979.

Primary Examiner—Evan Lawrence
Attorney, Agent, or Firm—Frishauf, Holtz, Goodman & Woodward

[57] ABSTRACT

A film forming apparatus comprises a reaction furnace having a reaction chamber therein, injection nozzles for introducing a reactive fluid, provided on the reaction furnace, a discharge nozzle for discharging a reactive fluid, provided on the reaction furnace, and a pair of susceptors located in almost vertical position in the reaction chamber and having facing sides separated by a specified distance. The susceptors include a plurality of depressions formed in the respective facing sides thereof for holding a plurality of silicon wafers. The paired susceptors are rotated in mutually opposite directions.

11 Claims, 2 Drawing Sheets

FILM FORMING APPARATUS

BACKGROUND OF THE INVENTION

This invention relates to a film forming apparatus for forming a film such as an epitaxial layer on objects to be coated with a film such as wafers.

Description of the Prior Art

With the trend toward higher integration and progressive microminimization of IC's, it is becoming a widespread practice to grow epitaxial crystals on semiconductor substrates (hereinafter referred to as wafers) for MOS devices, for example. As the wafers increase in diameter, the epitaxial layer is becoming gradually thinner.

The reaction apparatuses for epitaxial growth are broken down into three types: the horizontal reaction tube system, the vertical bell jar system and the barrel system. The latest addition is the recently-developed hot wall type, a modified version of the low pressure CVD system. The constructional outline of these reaction apparatuses is that a holder (hereinafter referred to as a susceptor) for holding wafers is placed in a high-temperature reaction furnace and reactive gases such as silicon tetrachloride (SiCl4) and silane are introduced into the reaction furnace.

In forming an epitaxial film, it is important to keep uniform the thickness and the electric resistance of the film in order to secure high quality. With any of the above-mentioned reaction apparatuses, however, it is impossible to control temperature in an epitaxial process to produce uniform temperatures for all the wafers and for the different positions of each wafer where chips are formed. As a result, the temperature distribution becomes non-uniform.

The temperature distribution of the wafers is determined according to a balance between the heat given by conduction and radiation from the susceptor and the heat loss by radiation from the surfaces of the wafers. Normally, the reason for the irregular temperature distribution is that the heat losses differ among the wafers and also at the different positions of each wafer even if the wafers are heated uniformly by the susceptor.

In some reaction furnaces of the bell jar system, a metal coating is formed on the outer surface to provide radiation heat so that the heat is distributed more uniformly, but the quantity of radiation heat from the metal coating decreases with the growth of an epitaxial layer, resulting in the temperature distribution becoming uneven. The metal coating deteriorates as the epitaxial process is repeated. In addition, the temperature distribution is made uneven by the inflow rate of a reactive fluid.

As set forth above, the conventional apparatuses have a drawback that the temperature distribution as well as the fluid flow is uneven, making it impossible to secure a uniform thickness and a uniform electric resistance for the epitaxial film.

If one wishes to form a film on a number of wafers at the same time, he has to use a large-size apparatus, which makes the temperature distribution even more irregular.

SUMMARY OF THE INVENTION

The object of this invention is to provide a film forming apparatus capable of forming a film on a number of objects in one process in a manner that the thickness and the resistance are uniform among the separate films and over the whole area of each film.

This and other objects of the invention are attained by positioning objects to be subjected to film formation on facing sides of at least two susceptors located in a reaction chamber. At least one of the susceptors is rotated around an axis perpendicular thereto relative to another susceptor.

DETAILED DESCRIPTION OF THE PREFERRED EMBODIMENTS

With reference to the accompanying drawings, description will now be made of film forming apparatuses according to the preferred embodiments of this invention, which epitaxially grow single-crystal silicon layers on silicon wafers whose surfaces have been finished in a mirror finish.

Figure 1:
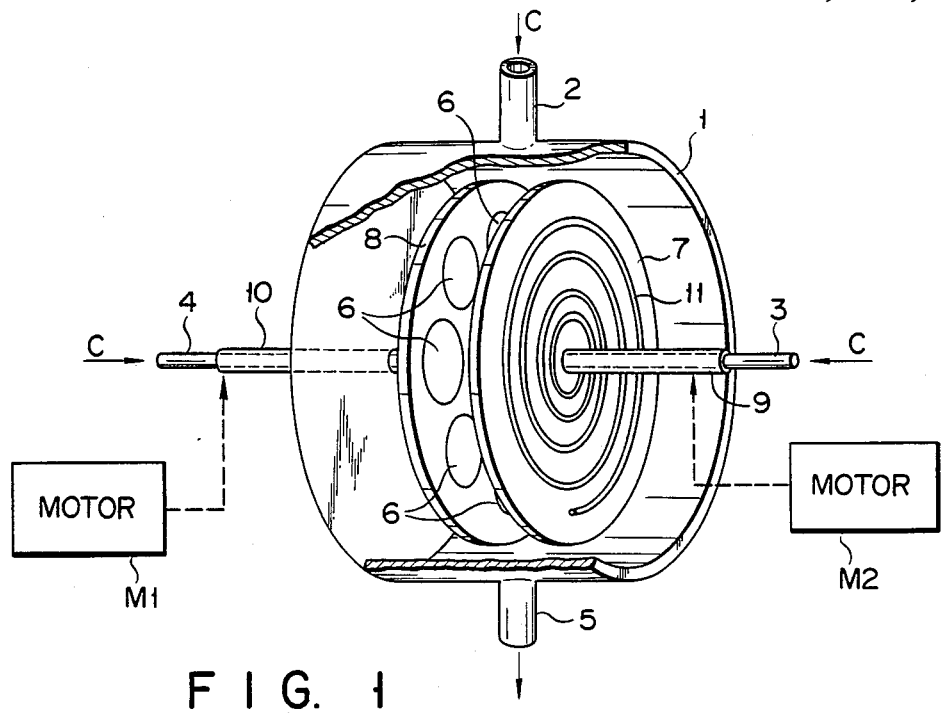
FIG. 1 is a diagrammatic perspective view partly in section of a film forming apparatus according to a first embodiment of this invention.

Referring to FIG. 1 showing a first embodiment of this invention, numeral 1 indicates a cylindrical reaction furnace having both its ends closed. The reaction furnace has a reaction chamber formed in it. Reaction furnace 1 is formed of a heat-resistant member such as quartz glass and a metal. The shape of this reaction furnace is not limited to a circular form, but may be elliptical or rectangular. Reaction furnace 1 may be cooled in operation by conducting cooling water through its walls. Injection nozzles 2, 3 and 4 are provided at the top center of the peripheral surface and at the centers of both sides of reaction furnace 1, respectively. These injected ports are connected to supply sources of gaseous reactive fluids such as silicon tetrachloride (SiCl4) and silane. The reactive fluids are supplied from these supply sources into the reaction chamber. Discharge nozzle 5 is provided at the bottom of the peripheral surface of reaction furnace 1. This discharge nozzle 5 is connected to a vacuum pump and a surplus fluid in the chamber is discharged from this discharge nozzle 5. The positions of the injection and discharge nozzles are not limited as described above. For example the injection and discharge nozzles may be respectively provided at the bottom and top portions of the furnace.

In this reaction chamber, there are provided a pair of disc-shaped holders or susceptors 7 and 8, located in almost vertical position and coaxially and opposed a specified distance apart. These susceptors are made of a heat-resistant material such as carbon. The susceptors have a number of circular depressions formed on their opposing sides. The circular depressions are arranged at specified intervals along a circle having its center at the center of each susceptor. The circle need not be one as in this embodiment, but may be plural. The depressions should preferably be arranged uniformly in radial direction from the center of each susceptor.

The individual depressions should have the same diameter which is a little larger than that of silicon wafers 6 to be inserted therein. Susceptors 7 and 8 are fixed respectively to one end each of hollow rotating shafts 9 and 10 extending coaxially. The other ends of rotating shafts 9 and 10 protrude outward through the side walls of reaction furnace 1 and rotatably supported by the side walls through bearings attached thereto.

In this embodiment, the above-mentioned injection nozzles 3 and 4, inserted into shafts 9 and 10, are composed of tubes which are open between the susceptors in the reaction chamber. The above-mentioned shafts 9 and 10 are connected respectively to first and second motors M1 and M2 and are rotated by these motors mutually in opposite directions. As a result, first susceptor 7 and second susceptor 8 rotate in the opposite directions.

Meanwhile, driving means to rotate the susceptors in the opposite directions may be composed of a motor and a transmission device to transmit two, normal and backward, torques derived from this motor.

High frequency coils 11 are attached to the sides of the above-mentioned susceptors 7 and 8 which are opposite to their sides facing each other. These coils are connected electrically to an external power source through known means such as slide contacts to enable electric power from a power source, not shown, which is located outside, to be supplied to the susceptors even when the susceptors are rotating.

The operation of a film forming apparatus constructed as described above will now be described in the following.

As illustrated, mirror-finished wafers 6 are placed in the depressions of susceptors 7 and 8 and held firmly therein by support means, not shown. To take examples, the holding means may be one which comprises a projected edge at the periphery of the depression which will be described later with reference to FIG. 3 or another means which is capable of setting desired diameters for the outer periphery of the wafer and the inner periphery of the depression to ensure a tight contact between them.

Then, while susceptors 7 and 8 are rotated mutually in opposite directions by driving motors M1 and M2, high frequency coil 11 is energized. The reactive fluid C is introduced into the reaction chamber through injection nozzles 2, 3 and 4 and the unnecessary gas in the chamber is discharged from discharge nozzle 5. Thus, an epitaxial layer is formed on the surfaces of wafers 6 by the reactive fluid.

With the film forming apparatus constructed as described, while the wafers to be coated with a film are held by a pair of susceptors, epitaxial layers are formed on the wafers. Therefore, it is possible to deposit a film on a number of wafers in one process, obviating the need to make a large-size apparatus. The wafers are located opposed by a pair of susceptors 7 and 8 and the opposing wafers are rotated changing their relative position. Hence, the mirror-finish faces of the wafers 6 reflect the radiation heat toward the wafers on the opposite side. In other words, the opposed wafers serve as the radiation heat sources with the result that the temperature distribution between the opposed wafers is made uniform with better efficiency.

The relative movements of susceptors 7 and 8 ensures a uniform temperature distribution over the whole areas of the susceptors. Therefore, the temperature distribution and the flow of the reactive fluid of not only over each wafer but of all wafers are made uniform. Consequently, the conditions of epitaxial reactions become identical for the surfaces of all wafers, thereby producing epitaxial films with uniform thickness and uniform resistance.

Figure 2:
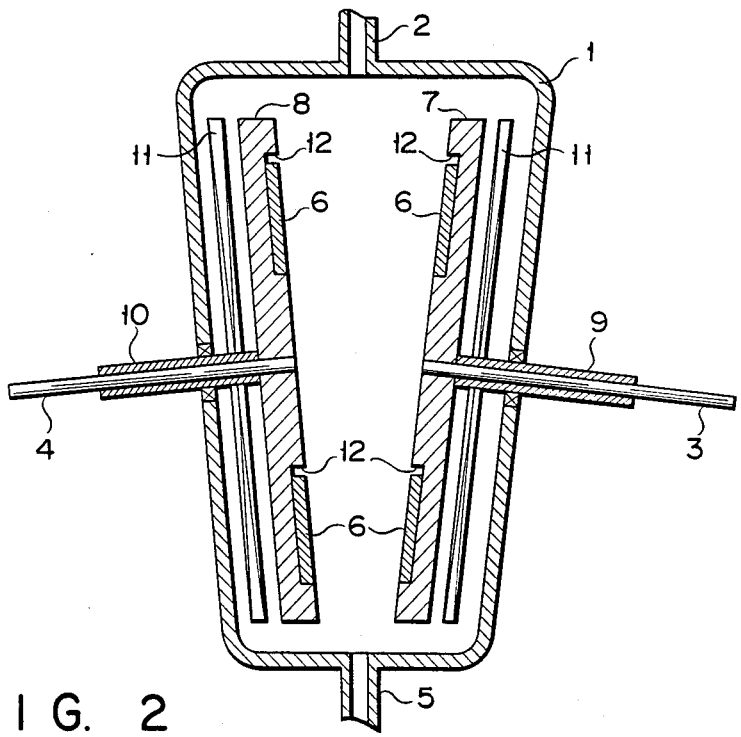
FIG. 2 is a diagrammatic sectional view of a film forming apparatus according to a second embodiment of this invention.
Figure 3:
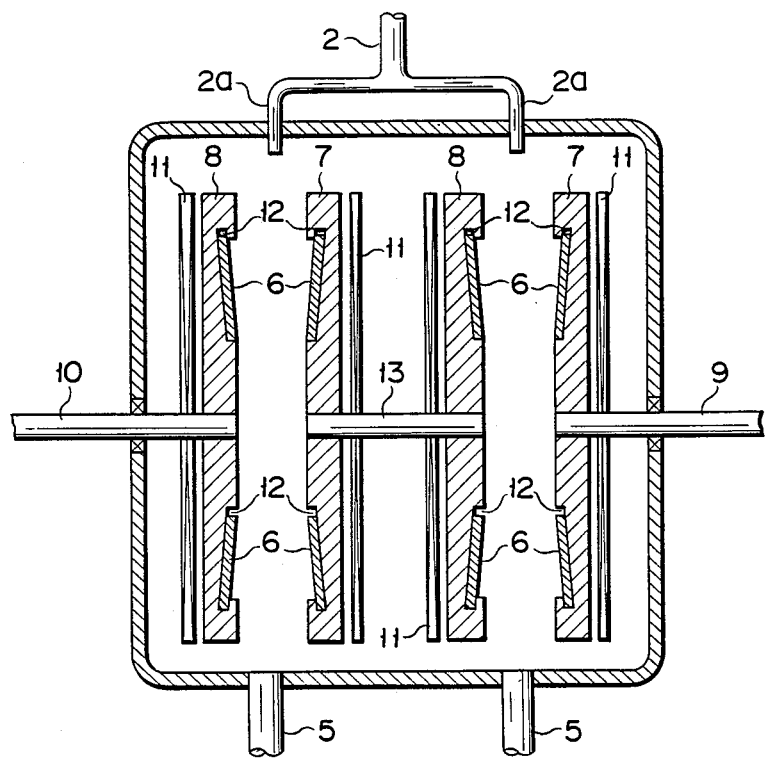
FIG. 3 is a diagrammatic sectional view of a film forming apparatus according to a third embodiment.

With reference to FIGS. 2 and 3, description will now be made of second and third embodiments. In these embodiments, the same numerals are used for those parts virtually identical to those in the first embodiment and their description will be omitted.

In the second embodiment as shown in FIG. 2, susceptors 7 and 8 are provided tilted a little so that their portions located at the lower positions come closer, with the result that the bottom faces of the depressions are tilted a little from a vertical plane. Thus, the wafers 6 in the depressions are prevented from dropping therefrom. Depressions 12 for holding wafers, provided in the susceptors, have the inside diameter a little larger than the outside diameter of wafers 6. If the inside diameter of depressions 12 is too large in relation to the outer diameter of wafers 6, the depressions' function to hold wafers is reduced. Hence, the former should preferably be less than 1.1 times larger than the latter.

If the inside diameter of the depressions is larger than this, there is a possibility that the wafer rotation in the depressions which occurs as the susceptors rotate becomes irregular, resulting in non-uniform rotation of the wafers. High frequency coils 11 are located a specified distance away and facing the sides of susceptors 7 and 8 which are opposite to the sides where the depressions are formed. Those coils 11 are fixed in reaction furnace 1 and rotating shafts 9 and 10 of susceptors 7 and 8 are inserted rotatably in the central portions of coils 11. Therefore, coils 11 are not rotated by the rotation of rotating shafts 9 and 10.

In the apparatus constructed as shown in FIG. 2, the wafers put in the depressions 12 of susceptors 7 and 8 do not fall out of the susceptors in an epitaxial process even if any special members are attached. When the susceptors rotate, the wafers rotate or make a toroidal motion as they revolve around the rotating shafts. Therefore, no local irregularity in temperature distribution occurs for the wafers. The space between susceptors 7 and 8 becomes narrower toward the bottom. Consequently, the reactive fluid flowing in the space increases in flow velocity as it flows downward and the dirt adhering to the susceptors is removed by the fluid flowing at high velocity and discharged from discharge nozzle 5.

In the third embodiment of FIG. 3, there are provided two pairs of susceptors 7 and 8 in reaction furnace 1. As in the above-described embodiment, connected to the members at the inside and outside of each pair of susceptors are rotating shafts 9 and 10 having gas supply tube coaxially inserted therein.

In this embodiment, the susceptors located inside are fixed by a fixed shaft and cannot rotate. As a result, only the susceptors located outside rotate in an epitaxial process. In this case, rotating shafts 9 and 10 may be rotated either in the same direction or in opposite directions.

In addition, it is also possible to rotate susceptors 7 and 8 in mutually opposite directions as in the above embodiments by using a rotating shaft in place of fixed shaft 13 and rotating the rotating shaft through a bevel gear or the like by means of a rotating shaft inserted at right angles with the above-mentioned rotating shafts 9 and 10 into reaction furnace 1. Susceptors 7 and 8 are provided in vertical position and depressions 12 for holding wafers, formed on one side each of the susceptors, have their bottom faces tilted. Thus, the wafers can be prevented from falling out of the susceptors just as the susceptors being tilted in the second embodiment. Injection nozzle 2 has two separate branches 2a, each one of which is located just above between a pair of susceptors 7 and 8. Each one of two discharge nozzles 5 is located just below between a pair of susceptors 7 and 8.

With the apparatus according to the third embodiment of this invention, it is possible to form epitaxial layers on wafers in greater numbers in one process.

Figure 4:
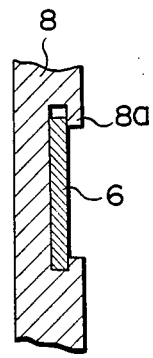
FIG. 4 is a partial sectional view of a modified example of wafer support means.

In the second and third embodiments of this invention, the wafers are seated a little tilted from a vertical plane to hold the wafers on the susceptors. However, as shown in FIG. 4, projected edge 8a may be formed at the periphery of each depression of susceptors 8 to hold the peripheral edge of wafer 6. Such a projected edge may be used in combination with a technique for tilting a wafer.

This invention is not limited to the above-described embodiments. For example, this invention may be applied to CVD processes other than the epitaxial process. The wafers used need not be confined to those of silicon but may be formed of other materials such as compound semiconductors. A pair of susceptors may be rotated in mutually opposite directions or one of the susceptors may be rotated. Also, the susceptors may be rotated at mutually different velocities. Put otherwise, it is only necessary to rotate the susceptors changing their relative position.

What is claimed is:

1. A film forming apparatus comprising:
   a reaction furnace having a reaction chamber therein;
   means coupled to said reaction furnace for introducing a reactive fluid, into said reaction chamber;
   means coupled to said reaction furnace for discharging a reactive fluid from said reaction chamber;
   at least two susceptors located in a generally vertical position in said reaction chamber and having respective sides facing each other;
   means for holding on each of said facing sides of the respective susceptors a plurality of objects to be subjected to a film formation process; and
   rotating means for rotating at least one of said susceptors, around an axis substantially perpendicular thereto, relative to another of said at least two susceptors.

2. The film forming apparatus according to claim 1, in whioh said rotating means includes means for rotating said at least two susceptors.

3. The film forming apparatus according to claim 2, in which said rotating means includes means for rotating said at least two susceptors in mutually opposite directions.

4. The film forming apparatus according to claim 1, in which said holding means includes a plurality of depressions formed on said opposing sides of said susceptors, in each of which an object to be coated with a film is placed.

5. The film forming apparatus according to claim 4, in which said depressions have an inside diameter larger than the outer diameter of the objects to be coated with a film and smaller than 1.1 times said outer diameter of the objects.

6. The film forming apparatus according to claim 4, in which said depressions have bottom faces which are tilted from a vertical plane.

7. The film forming apparatus according to claim 4, in which said holding means includes projecting edges provided at peripheral edges of said depressions, each projecting edge being capable of holding a peripheral edge of an object subject to film formation.

8. The film forming apparatus according to claim 1, in which said susceptors are located tilted from a vertical plane so that space between their respective facing sides becomes narrower toward the bottom, said fluid introducing means being provided at the top of said reaction chamber, said discharging means being provided at the bottom of said reaction chamber.

9. The film forming apparatus according to claim 1, further comprising means coupled to the rotating means for heating said objects.

10. The film forming apparatus according to claim 9, wherein said heating means comprises electrical conductors mounted on said at least two susceptors in the respective side opposite to that on which the plurality of objects is held.

11. The film forming apparatus according to claim 9, wherein said heating means comprises electrical conductors mounted on surfaces parallel, respectively, to said at least two susceptors and spaced therefrom.

* * * * *